United States Patent
Hatakeyama et al.

(10) Patent No.: US 12,476,105 B2
(45) Date of Patent: Nov. 18, 2025

(54) DIRECTIONAL SELECTIVE FILL FOR SILICON GAP FILL PROCESSES

(71) Applicant: Applied Materials, Inc., Santa Clara, CA (US)

(72) Inventors: Taiki Hatakeyama, Cupertino, CA (US); Bhargav S. Citla, Fremont, CA (US); Qiang Ma, Cupertino, CA (US); Biao Liu, San Jose, CA (US); Srinivas D. Nemani, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 354 days.

(21) Appl. No.: 18/095,279

(22) Filed: Jan. 10, 2023

(65) Prior Publication Data

US 2024/0234128 A1    Jul. 11, 2024

(51) Int. Cl.
*H01L 21/02* (2006.01)
*H01J 37/32* (2006.01)
*H01L 21/311* (2006.01)

(52) U.S. Cl.
CPC .. *H01L 21/02167* (2013.01); *H01J 37/32146* (2013.01); *H01L 21/02274* (2013.01); *H01L 21/0228* (2013.01); *H01L 21/31116* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 6,755,945 B2 | 6/2004 | Yasar et al. | |
| 6,867,086 B1 | 3/2005 | Chen et al. | |
| 9,202,708 B1 * | 12/2015 | Chen | H01L 21/31116 |
| 2021/0082667 A1 | 3/2021 | Zhao et al. | |
| 2022/0020594 A1 | 1/2022 | Jiang et al. | |

FOREIGN PATENT DOCUMENTS

WO    2012030500 A1    3/2012

OTHER PUBLICATIONS

Application No. PCT/US2023/085882, International Search Report and Written Opinion, Mailed on May 1, 2024, 13 pages.

* cited by examiner

*Primary Examiner* — Roberts P Culbert
(74) *Attorney, Agent, or Firm* — Kilpatrick Townsend & Stockton LLP

(57) ABSTRACT

Exemplary processing methods may include providing a silicon-containing precursor and a carbon-containing precursor to a processing region of a semiconductor processing chamber. A substrate may be housed in the processing region. The substrate may define a feature within the substrate. The methods may include forming plasma effluents of the silicon-containing precursor and the carbon-containing precursor. The methods may include depositing a silicon-and-carbon-containing material on the substrate. The methods may include providing a hydrogen-containing precursor to the processing region of the semiconductor processing chamber, forming plasma effluents of the hydrogen-containing precursor, and etching the silicon-and-carbon-containing material from a sidewall of the feature within the substrate. The methods may include providing a nitrogen-containing precursor to the processing region of the semiconductor processing chamber, forming plasma effluents of the nitrogen-containing precursor, and doping the silicon-and-carbon-containing material with nitrogen.

21 Claims, 4 Drawing Sheets

DIRECTIONAL SELECTIVE FILL FOR SILICON GAP FILL PROCESSES

TECHNICAL FIELD

The present technology relates to semiconductor processing. More specifically, the present technology relates depositing and etching materials to form densified seam-free materials in gap fill processes.

BACKGROUND

Integrated circuits are made possible by processes which produce intricately patterned material layers on substrate surfaces. Producing patterned material on a substrate requires controlled methods of formation and removal of exposed material. As device sizes continue to shrink, material formation may affect subsequent operations. For example, in gap filling operations a material may be formed or deposited to fill a trench or other feature formed on a semiconductor substrate. As features may be characterized by higher aspect ratios and reduced critical dimensions, these filling operations may be challenged. For example, as the deposition may occur at the top and along sidewalls of the feature, continued deposition may pinch off the feature including between sidewalls within the feature, and may produce voids within the feature. This can impact device performance and subsequent processing operations.

Thus, there is a need for improved systems and methods that can be used to produce high quality devices and structures. These and other needs are addressed by the present technology.

SUMMARY

Exemplary processing methods may include providing a silicon-containing precursor and a carbon-containing precursor to a processing region of a semiconductor processing chamber. A substrate may be housed in the processing region. The substrate may define a feature within the substrate. The processing region may be at least partially defined between a faceplate and a substrate support on which the substrate is seated. The methods may include forming plasma effluents of the silicon-containing precursor and the carbon-containing precursor. The methods may include depositing a silicon-and-carbon-containing material on the substrate. The methods may include providing a hydrogen-containing precursor to the processing region of the semiconductor processing chamber. The methods may include forming plasma effluents of the hydrogen-containing precursor. The methods may include etching the silicon-and-carbon-containing material from a sidewall of the feature within the substrate with the plasma effluents of the hydrogen-containing precursor. The methods may include providing a nitrogen-containing precursor to the processing region of the semiconductor processing chamber. The methods may include forming plasma effluents of the nitrogen-containing precursor. The methods may include doping the silicon-and-carbon-containing material with nitrogen from the plasma effluents of the nitrogen-containing precursor.

In some embodiments, the feature within the substrate may be characterized by an aspect ratio of greater than or about 2:1. The feature may be characterized by a width across the feature of less than or about 20 nm. A bias power may be applied to the substrate support from a bias power source. The bias power source may be operated in a pulsing mode at a pulsing frequency of less than or about 1 kHz during both the depositing and the etching. The bias power source may be operated at a duty cycle of less than or about 50% during both the depositing and the etching. A plasma power source may be operated in a continuous wave mode while the bias power source is operated in a pulsing mode during the depositing and the etching. The plasma effluents of the silicon-containing precursor and the carbon-containing precursor may be formed at a first power level from a plasma power source. The plasma effluents of the hydrogen-containing precursor may be formed at a second power level from the plasma power source less than the first power level. The method may include densifying remaining silicon-and-carbon-containing material within the feature defined within the substrate with the plasma effluents of the hydrogen-containing precursor. The densifying may include reducing a hydrogen content of the remaining silicon-and-carbon-containing material to less than or about 30 at. %. The silicon-containing precursor may be provided at a flow rate ratio of greater than or about 1:1 relative to the carbon-containing precursor. The method may be repeated for a second cycle. A thickness of the silicon-and-carbon-containing material may be less than or about 5 nm. A pressure within the semiconductor processing chamber may be maintained at a pressure of less than or about 10 Torr.

Some embodiments of the present technology encompass semiconductor processing methods. The methods may include i) forming plasma effluents of a silicon-containing precursor and a carbon-containing precursor. The methods may include ii) depositing a silicon-and-carbon-containing material on a substrate. The substrate may define a feature within the substrate. The substrate may be seated on a substrate support. The methods may include iii) forming plasma effluents of a hydrogen-containing precursor. The methods may include iv) etching the silicon-and-carbon-containing material from a sidewall of the feature within the substrate with the plasma effluents of the hydrogen-containing precursor. The methods may include v) forming plasma effluents of a nitrogen-containing precursor. The methods may include vi) doping the silicon-and-carbon-containing material with nitrogen from the plasma effluents of the nitrogen-containing precursor. The methods may include repeating operations i) through vi) to iteratively fill the feature.

In some embodiments, a bias power may be applied to the substrate support from a bias power source. The bias power source may be operated in a pulsing mode at a frequency of less than or about 1 kHz. The bias power source may be operated at a duty cycle of less than or about 25%. The bias power source may be operated at a plasma power of less than or about 750 W. The etching may fully remove the silicon-and-carbon-containing material from sidewalls of the feature above a base fill of the feature. The carbon-containing precursor may be or include a silicon-and-carbon containing precursor. A temperature of the substrate may be maintained at a temperature of greater than or about 100° C.

Some embodiments of the present technology encompass semiconductor processing methods. The methods may include providing a silicon-containing precursor and a carbon-containing precursor to a processing region of a semiconductor processing chamber. A substrate may be housed in the processing region. The substrate may define a feature within the substrate. The processing region may be at least partially defined between a faceplate and a substrate support on which the substrate is seated. The methods may include forming plasma effluents of the silicon-containing precursor and the carbon-containing precursor. The plasma effluents of the silicon-containing precursor may be formed at a first power level from a plasma power source. The methods may include depositing a silicon-and-carbon-containing material on the substrate. A carbon content of the silicon-and-carbon-containing material may be less than or about 50 at. %. The methods may include providing a hydrogen-containing precursor to the processing region of the semiconductor processing chamber. The methods may include forming plasma effluents of the hydrogen-containing precursor. The plasma effluents of the hydrogen-containing precursor may be formed at a second power level from the plasma power source less than the first power level. The methods may include etching the silicon-and-carbon-containing material from a sidewall of the feature within the substrate with the plasma effluents of the hydrogen-containing precursor. The etching may fully remove the silicon-and-carbon-containing material from sidewalls of the feature above a base fill of the feature. The methods may include providing a nitrogen-containing precursor to the processing region of the semiconductor processing chamber. The methods may include forming plasma effluents of the nitrogen-containing precursor. The methods may include doping the silicon-and-carbon-containing material with nitrogen from the plasma effluents of the nitrogen-containing precursor.

In some embodiments, depositing the silicon-and-carbon-containing material on the substrate may be performed at a first spacing distance from the faceplate. Etching the silicon-and-carbon-containing material from the sidewall of the feature within the substrate may be performed at a second spacing distance from the faceplate. The second spacing distance may be less than the first spacing distance.

Such technology may provide numerous benefits over conventional systems and techniques. For example, by performing a sequential deposition and etch operation according to embodiments of the present technology, sidewall coverage can be limited or controlled, which may limit seam or void formation in small features. Additionally, by treatment operations subsequent to deposition and etch operations according to embodiments of the present technology, doped silicon-containing material for gap fill operations may be provided. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
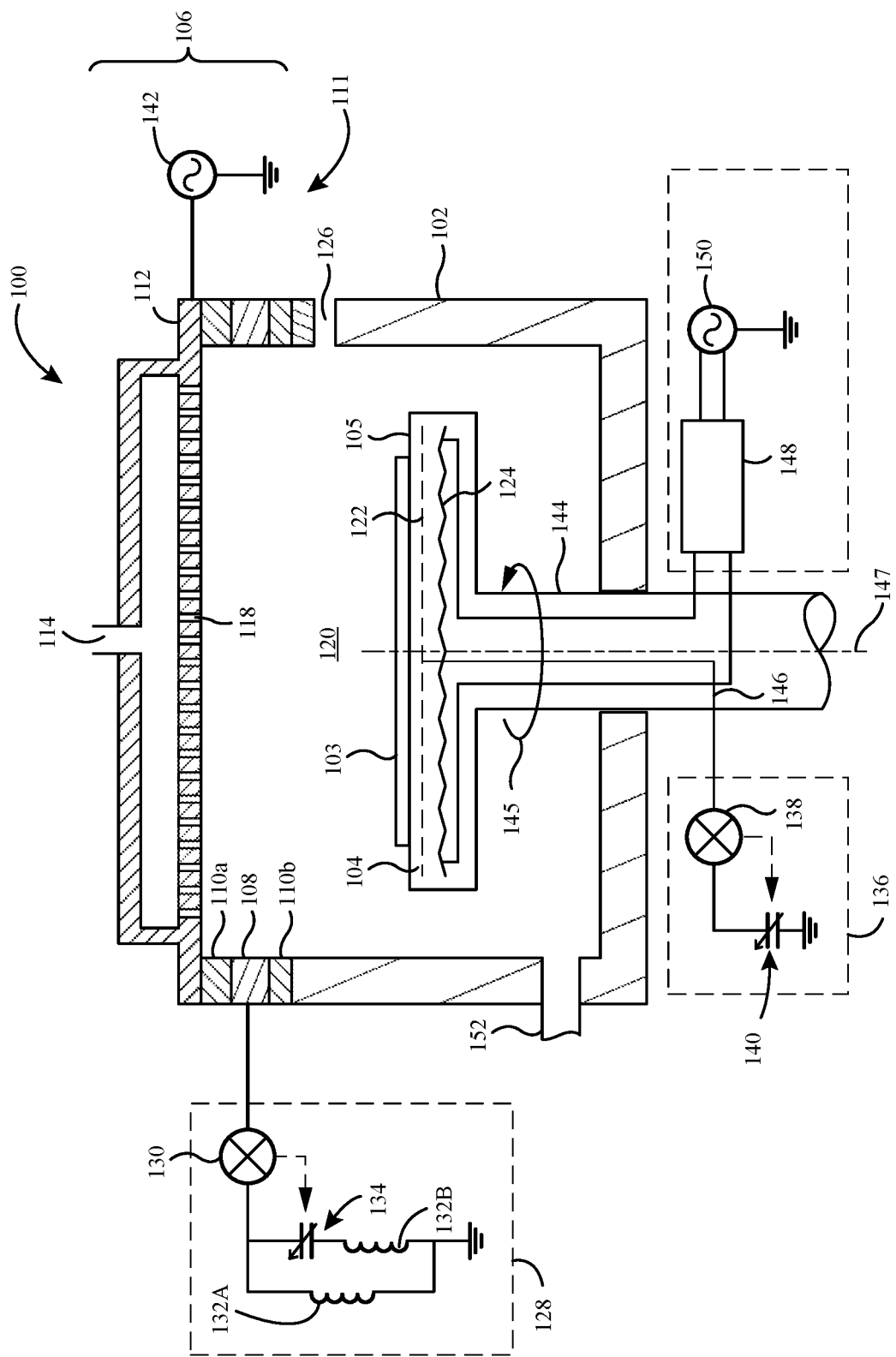
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Amorphous silicon-and-carbon-containing materials may be used in semiconductor device manufacturing for a number of structures and processes, including as a trench fill or gap fill material. In some gap filling operations, processing may utilize plasma-enhanced deposition under process conditions to increase the directionality of the deposition, which may allow the deposited material to better fill features on the substrate. In other gap filling operations, processing may utilize flowable films under process conditions to avoid the formation of seams and/or voids in the deposited material.

As feature sizes continue to shrink, plasma-enhanced depositions may be challenged for narrow features, which may be further characterized by higher aspect ratios. For example, pinching of the feature may more readily occur due to deposition on sidewalls of the feature, which in small feature sizes may further restrict flow and deposition further into the feature, and may produce seams or voids in the deposited material. Conventional technologies have attempted to address the formation of seams or voids by performing intermittent etch operations to remove materials from the sidewalls of the features being filled. However, conventional etch operations have required many cycles to limit seam or void formation. Alternatively, conventional technologies have attempted to use flowable films. However, flowable films may form a porous material that cannot withstand subsequent integration processing, such as etching or ashing operations. Additionally, flowable films may be prone to shrinkage during curing operations, which may damage the structure or result in void formation.

The present technology may overcome these limitations by performing an intermittent etch of the formed film. The etch may limit or prevent sidewall coverage during trench fill, allowing improved fill operations to be performed. Additionally, the present technology may perform a nitrogen treatment to introduce a nitrogen dopant into the deposited material.

After describing general aspects of a chamber according to some embodiments of the present technology in which plasma processing operations discussed below may be performed, specific methodology may be discussed. It is to be understood that the present technology is not intended to be limited to the specific films, chambers, or processing discussed, as the techniques described may be used to improve a number of film formation processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may perform one or more deposition or other processing operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112, also referred to as a faceplate, and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
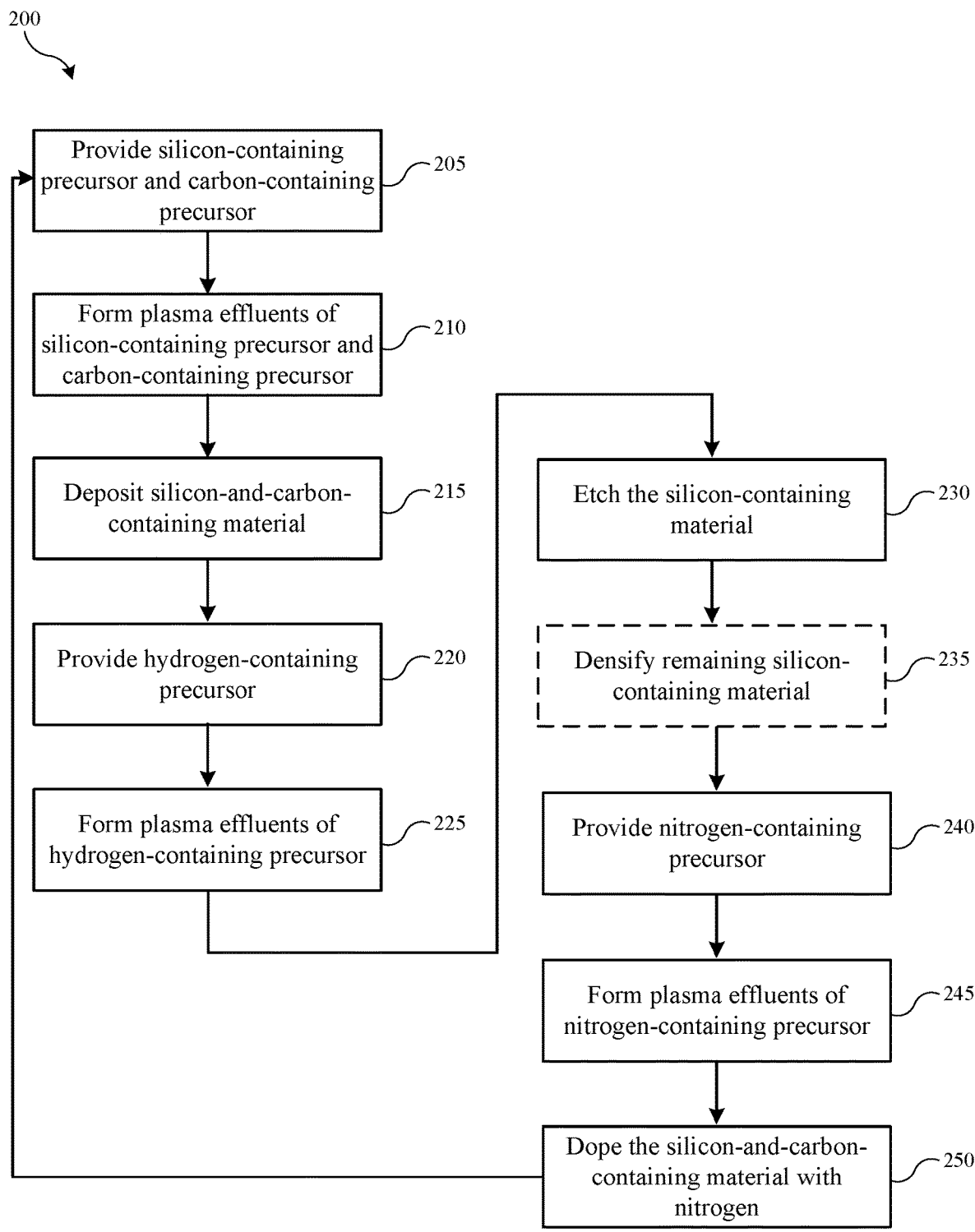
FIG. 2 shows exemplary operations in a processing method according to some embodiments of the present technology.

Processing chamber 100 may be utilized in some embodiments of the present technology for processing methods that may include formation or etching of materials for semiconductor structures. It is to be understood that the chamber described is not to be considered limiting, and any chamber that may be configured to perform operations as described may be similarly used. FIG. 2 shows exemplary operations in a processing method 200 according to some embodiments of the present technology. The method may be performed in a variety of processing chambers and on one or more mainframes or tools, including processing chamber 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 200 may describe operations shown schematically in FIGS. 3A-3E, the illustrations of which will be described in conjunction with the operations of method 200. It is to be understood that the figures illustrate only partial schematic views, and a substrate may contain any number of additional materials and features having a variety of characteristics and aspects as illustrated in the figures.

Method 200 may include additional operations prior to initiation of the listed operations. For example, additional processing operations may include forming structures on a substrate, which may include both forming and removing material. For example, transistor structures, memory structures, or any other structures may be formed. Prior processing operations may be performed in the chamber in which method 200 may be performed, or processing may be performed in one or more other processing chambers prior to delivering the substrate into the semiconductor processing chamber or chambers in which method 200 may be performed. Regardless, method 200 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing volume 120 described above.

A substrate on which several operations have been performed may be substrate 305 of a structure 300, which may show a partial view of a substrate on which semiconductor processing may be performed. It is to be understood that structure 300 may show only a few top layers during processing to illustrate aspects of the present technology. The substrate 305 may include a material in which one or more features 310 may be formed. Substrate 305 may be any number of materials used in semiconductor processing. The substrate material may be or include silicon, germanium, dielectric materials including silicon oxide or silicon nitride, metal materials, or any number of combinations of these materials, which may be the substrate 305, or materials formed in structure 300. Features 310 may be characterized by any shape or configuration according to the present technology. In some embodiments, the features may be or include a trench structure or aperture formed within the substrate 305.

Although the features 310 may be characterized by any shapes or sizes, in some embodiments the features 310 may be characterized by higher aspect ratios, or a ratio of a depth of the feature to a width across the feature. For example, in some embodiments, features 310 may be characterized by aspect ratios greater than or about 2:1, and may be characterized by aspect ratios greater than or about 3:1, greater than or about 5:1, greater than or about 10:1, or greater. Additionally, the features may be characterized by narrow widths or diameters across the feature including between two sidewalls, such as a dimension less than or about 20 nm, and may be characterized by a width across the feature of less than or about 15 nm, less than or about 12 nm, less than or about 10 nm, less than or about 9 nm, less than or about 8 nm, less than or about 7 nm, less than or about 6 nm, less than or about 5 nm, or less.

In some embodiments, method 200 may include optional treatment operations, such as a pretreatment, that may be performed to prepare a surface of substrate 305 for deposition. Once prepared, method 200 may include providing one or more precursors to a processing region of the semiconductor processing chamber housing the structure 300 at operation 205. The precursors may include one or more silicon-containing precursors and one or more carbon-containing precursors, as well as one or more diluents or carrier gases such as an inert gas or other gas delivered with the silicon-containing precursor and the carbon-containing precursor. The carrier gases may include, but are not limited to, helium, argon, xenon, as well as any other inert gas or other gas. Silicon-containing precursors that may be used during deposition of the silicon-and-carbon-containing material 315 may include, but are not limited to, silane ($SiH_4$), disilane ($Si_2H_6$), trisilane ($Si_3H_8$), tetrasilane ($Si_4H_{10}$), pentasilane ($SiSH_{12}$), or other organosilanes including cyclohexasilanes, silicon tetrafluoride ($SiF_4$), silicon tetrachloride ($SiCl_4$), dichlorosilane ($SiH_2Cl_2$), tetraethyl orthosilicate (TEOS), as well as any other silicon-containing precursors that may be used in silicon-and-carbon-containing film formation. Carbon-containing precursors that may be used during deposition of the silicon-and-carbon-containing material 315 may include, but are not limited to, dimethylsilane ($C_2H_8Si$), trimethylsilane ($C_3H_{10}Si$), tetramethylsilane ($C_4H_{12}Si$), neopentasilane (($SiH_3)_4Si$), tetraethyl orthosilicate (TEOS), as well as any other carbon-containing precursors that may be used in silicon-and-carbon-containing film formation.

Deposition plasma effluents may be formed of the deposition precursors including the silicon-containing precursor and the carbon-containing precursor at operation 210. The deposition plasma effluents may be formed within the processing region, which may allow deposition materials to deposit on the substrate 305. For example, in some embodiments a capacitively-coupled plasma may be formed within the processing region by applying plasma power to the faceplate or substrate support as previously described.

The power applied during deposition may be a lower power plasma, which may limit dissociation, and which may maintain an amount of carbon incorporation in the deposited materials. Accordingly, in some embodiments a plasma power source may deliver a plasma power to the faceplate or substrate support of less than or about 500 W, and may deliver a power of less than or about 450 W, less than or about 400 W, less than or about 350 W, less than or about 300 W, or less. At plasma powers to the faceplate or substrate support of greater than, for example, 500 W, the substrate 305, such as the sidewalls defining the features 310, may be damaged.

During the deposition operation, an additional power source, a bias power source, may be engaged and coupled with the substrate support as previously described to provide a bias to the plasma generated above the substrate 305. This may draw plasma effluents to the substrate 305, which may increase deposition at the bottom of the features 310. The bias power applied may be relatively low to limit damage to the structure. Accordingly, in some embodiments a plasma power source may deliver a bias plasma power to the substrate support of less than or about 1,000 W, and may deliver a power of less than or about 750 W, less than or about 600 W, less than or about 500 W, less than or about 450 W, less than or about 400 W, less than or about 350 W, less than or about 300 W, or less. Additionally, by adjusting the source power and the bias power applied, densification of the deposited silicon-and-carbon-containing material 315 may occur during the deposition operation.

Figure 3A:
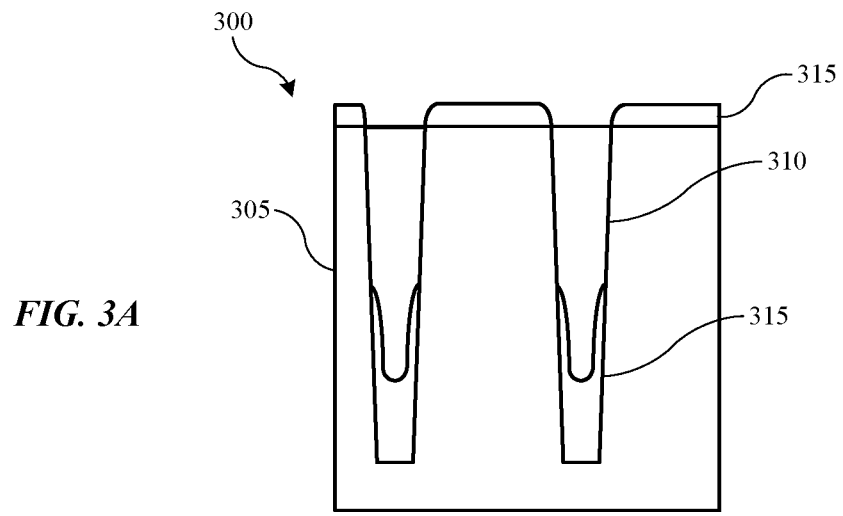
FIGS. 3A-3E show schematic cross-sectional views of a substrate during a processing according to some embodiments of the present technology.

A silicon-and-carbon-containing material 315 may be deposited on the substrate at operation 215 from plasma effluents of the silicon-containing precursor and the carbon-containing precursor. The silicon-and-carbon-containing material 315 may be or include an amorphous material. The deposited silicon-and-carbon-containing material 315 may at least partially fill the features 310 on the substrate 305 to provide a bottom-up type of gap fill. As illustrated in FIG. 3A, the silicon-and-carbon-containing material 315 may be deposited on the substrate 305, and deposit at the bottom of the features 310, as well as above the features 310 on the substrate 305 and on the sidewalls of the features 310. Although the amount of silicon-and-carbon-containing material 315 deposited on the sidewalls may be relatively small or thin, continued formation may cause the features 310 to be pinched off. If pinched off, the formation of a seam or void in the silicon-and-carbon-containing material 315 may occur as the gap fill continues. Accordingly, a series of depositions, etches, and/or treatments, as further described below, may be performed to deposit seam-free and void-free silicon-and-carbon-containing material 315 in the features 310.

A carbon content of the silicon-and-carbon-containing material 315 may be less than or about 50 at. %. At higher carbon contents, subsequent etch operations may not be able to etch through the silicon-and-carbon-containing material 315. Accordingly, the carbon content of the silicon-and-carbon-containing material 315 may be less than or about 45 at. %, and may be less than or about 40 at. %, less than or about 35 at. %, less than or about 30 at. %, less than or about 25 at. %, less than or about 20 at. %, less than or about 15 at. %, less than or about 10 at. %, or less. In order to maintain the carbon content of the silicon-and-carbon-containing material 315 less than or about 50 at. %, the silicon-containing precursor may be provided at a higher flow rate than the carbon-containing precursor. For example, the silicon-containing precursor may be provided at a flow rate ratio of greater than or about 1:1 relative to the carbon-containing precursor, and may be provided at a flow rate ratio of greater than or about 1.2:1, greater than or about 1.4:1, greater than or about 1.6:1, greater than or about 1.8:1, greater than or about 2:1, greater than or about 2.2:1, greater than or about 2.4:1, greater than or about 2.6:1, greater than or about 2.8:1, greater than or about 3:1, or more. In embodiments, a flow rate of the silicon-containing precursor may be maintained at less than or about 500 sccm, and may be maintained at less than or about 450 sccm, less than or about 400 sccm, less than or about 350 sccm, less than or about 300 sccm, less than or about 250 sccm, less than or about 200 sccm, less than or about 150 sccm, less than or about 100 sccm, or less. Higher flow rates may increase the deposition rate and may result in the features 310 being filled too quickly.

Subsequent an amount of deposition, in some embodiments of the present technology an etching or modification process may be performed that is configured to etch back the formed material. This process may be performed in the same chamber as the deposition, and may be performed in a cyclic process to fill the feature. In some embodiments the silicon-containing precursor flow and/or the carbon-containing precursor flow may be halted and the processing region may be purged. Subsequent a purge, a hydrogen-containing precursor may be provided to the processing region of the semiconductor processing chamber at operation 220. Etching plasma effluents may be formed at operation 225, which may also be a capacitively-coupled plasma formed within the processing region, although in some embodiments an inductively-coupled plasma may similarly be applied. The etching plasma effluents may be formed by applying a plasma power to the faceplate or substrate support, and in some embodiments no other power source may be engaged.

Similar to the deposition operation, during the etching operation, the bias power source may be engaged to provide a bias to the plasma generated above the substrate 305. This may draw plasma effluents to the substrate 305, which may bombard the silicon-and-carbon-containing material 315 and cause densification of the deposited silicon-and-carbon-containing material 315. Although any hydrogen-containing material may be used, in some embodiments diatomic hydrogen may be used as the hydrogen-containing precursor to produce the etching plasma, along with one or more additional precursors. In embodiments, the hydrogen radicals and ions may readily penetrate the materials formed within the features 310, and may release incorporated hydrogen from the silicon-and-carbon-containing material 315 causing densification. The bias power applied may be relatively low to limit sputtering of the silicon-and-carbon-containing material 315 as well as to limit any potential damage to any underlying structure. Materials delivered to form the plasma may similarly have a reduced amount of heavier materials to limit sputtering of the deposited films. Additionally, by adjusting the source power and the bias power applied, an etching operation may be performed, which may reduce sidewall coverage of the deposited material.

As previously discussed, hydrogen, or any other hydrogen-containing material may be utilized to generate a plasma within the processing region by delivering power to the faceplate from the plasma power source. The source plasma power in some embodiments may be equal to or less than a plasma power used during the deposition. For example, the plasma power delivered may be less than or about 500 W, and may deliver a power of less than or about 450 W, less than or about 400 W, less than or about 350 W, less than or about 300 W, less than or about 250 W, or less. At plasma powers to the faceplate or substrate support of greater than, for example, 500 W, the substrate 305, such as the sidewalls defining the features 310, may be damaged. Additionally, aspects of the bias power may also be adjusted, which may also limit damage to the underlying structure. For example, the bias power may be maintained below or about 1,000 W, and may be below or about 750 W, below or about 600 W, below or about 500 W, below or about 400 W, or less. While in some operations, a bias power may be higher than a plasma source power, the bias power may alternatively be maintained below the plasma power in other operations.

Applying greater bias may increase a directionality of delivery perpendicular to a plane across the substrate. Accordingly, by reducing the bias power supplied, the amount of directionality may reduce, which may increase interaction of the plasma effluents within the feature 310. The plasma effluents may then etch the silicon-and-carbon-containing material 315 at operation 230, and may remove the silicon-and-carbon-containing material 315 from the sidewalls of the features 310. The plasma effluents may fully remove silicon-and-carbon-containing material 315 from the sidewalls of the features 310 above a base fill of the silicon-and-carbon-containing material 315. The base fill of the silicon-and-carbon-containing material 315 may refer to the silicon-and-carbon-containing material 315 deposited at the bottom of the features 310, or on the previously deposited silicon-and-carbon-containing material 315 toward the bottom of the features 310.

Figure 3B:
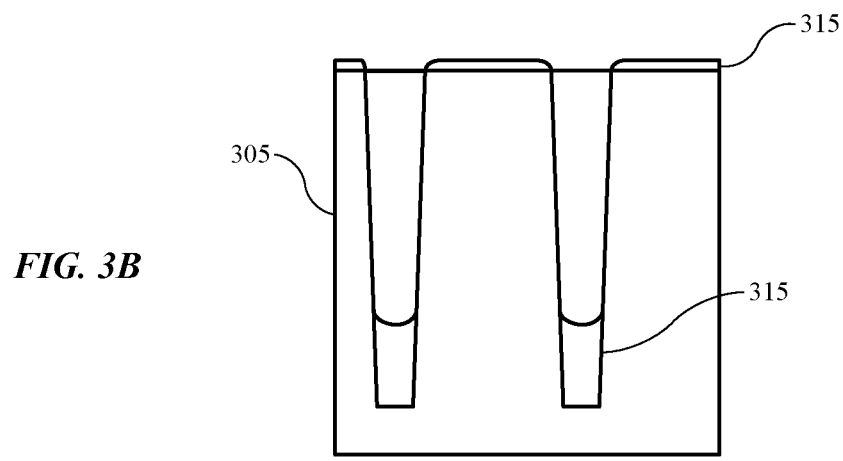

Simultaneously, or additionally, plasma effluents delivered more directionally may penetrate the remaining silicon-and-carbon-containing material 315 formed at the bottom of the features 310 and/or on the substrate 305. As previously discussed, this penetration may reduce hydrogen incorporation to densify the film at optional operation 235. As illustrated in FIG. 3B, silicon-and-carbon-containing material 315 may be removed from sidewalls of the features 310, from overhang regions of the substrate 305, and/or from an upper surface of the substrate 305. This removal may maintain the deposited silicon-and-carbon-containing material 315 at bottom regions of the features 310 and/or on an upper surface of the substrate 305. The process may also provide a reduced hydrogen incorporation in the remaining material, such as a hydrogen incorporation of less than or about 40 at. %, and may provide a reduced hydrogen incorporation of less than or about 35 at. %, less than or about 30 at. %, less than or about 25 at. %, less than or about 20 at. %, less than or about 15 at. %, less than or about 10 at. %, less than or about 5 at. %, or less.

Additional adjustments may be made to further increase etching of deposited material along sidewalls of the features by adjusting one or more characteristics of the plasma power or bias power being supplied. For example, in some embodiments both the plasma power source and bias power source may be operated in a continuous wave mode. Additionally, one or both of the power sources may be operated in a pulsed mode. In some embodiments, the source power may be operated in a continuous wave mode or pulsed mode while the bias power is operated in a pulsed mode. A pulsing frequency for the bias power may be greater than or about 100 Hz, and may be greater than or about 200 Hz, greater than or about 300 Hz, greater than or about 500 Hz, greater than or about 750 Hz, greater than or about 1,000 Hz, greater than or about 1,500 Hz, greater than or about 2,000 Hz, or greater. Similarly, a pulsing frequency for the bias power may be less than or about 5,000 Hz, and may be less than or about 4,500 Hz, less than or about 4,000 Hz, less than or about 3,500 Hz, less than or about 3,000 Hz, less than or about 2,500 Hz, less than or about 1,000 Hz, less than or about 500 Hz, or less. The duty cycle of the bias power may be less than or about 75%, and the bias power may be operated at a duty cycle of less than or about 70%, less than or about 60%, less than or about 50%, less than or about 40%, less than or about 30%, less than or about 20%, less than or about 10%, less than or about 5%, or less. By operating the bias power for a reduced duty cycle, such as an on-time duty of less than or about 50%, a greater amount of time per cycle may be performing a more isotropic etch within the feature, which may better remove material from the sidewalls.

Additional power configurations may also include an amount of synchronization of the source power and the bias power in a master/slave relationship. For example, both power supplies may be operated in a pulsing orientation, and the bias power may be synchronized to engage after the source power has been engaged at each pulse. A level-to-level pulsing scheme may also be applied. For example, during the on duty of the bias power, the source power may be operated at a first plasma power. During the remainder of the cycle where the bias power is off, the source power may be operated at a second plasma power, which may be greater than the first plasma power. This may both increase isotropic etching by removing the bias-induced directionality, and may also increase etching characteristics of the isotropic etch.

Subsequent an amount of etching, in some embodiments of the present technology a treatment or doping process may be performed that is configured to incorporate additional material in the formed material. This process may be performed in the same chamber as the deposition and/or the etching, and may be performed in a cyclic process to fill the feature. In some embodiments the hydrogen-containing precursor flow may be halted and the processing region may be purged. Subsequent a purge, a treatment precursor may be provided to the processing region of the semiconductor processing chamber at operation 240. Treatment plasma effluents may be formed at operation 245, which may also be a capacitively-coupled plasma formed within the processing region, although in some embodiments an inductively-coupled plasma may similarly be applied. The treatment plasma effluents may be formed by applying a plasma power to the faceplate or substrate support, and in some embodiments no other power source may be engaged.

Similar to the etching operation, during the treatment operation, the bias power source may be engaged to provide a bias to the plasma generated above the substrate 305. This may draw plasma effluents to the substrate 305, which may bombard the silicon-and-carbon-containing material 315 and cause doping of the deposited silicon-and-carbon-containing material 315. Although any treatment precursor to incorporate a dopant into the silicon-and-carbon-containing material 315 may be used, in some embodiments a nitrogen-containing precursor, such as diatomic nitrogen, may be used as the treatment precursor, along with one or more additional precursors. The additional precursors may include one or more diluents or carrier gases such as an inert gas or other gas delivered with the treatment precursor. The carrier gases may include, but are not limited to, helium, argon, xenon, as well as any other inert gas or other gas. However, it is contemplated that other precursors may be used depending on the dopant to be introduced to the silicon-and-carbon-containing material 315. In embodiments, the nitrogen radicals and ions, for example, may readily penetrate the materials formed within the features 310, and may bond with terminal silicon, hydrogen, or other materials in the silicon-and-carbon-containing material 315 causing nitrogen incorporation in the material. The bias power applied may be relatively low to limit sputtering of the silicon-and-carbon-containing material 315 as well as to limit any potential damage to any underlying structure. Materials delivered to form the plasma may similarly have a reduced amount of heavier materials to limit sputtering of the deposited films.

As previously discussed, nitrogen, or any other nitrogen-containing material may be utilized to generate a plasma within the processing region by delivering power to the faceplate from the plasma power source. The source plasma power in some embodiments may be equal to or less than a plasma power used during the deposition and/or the etching. For example, the plasma power delivered may be less than or about 400 W, and may deliver a power of less than or about 350 W, less than or about 300 W, less than or about 250 W, less than or about 200 W, or less. At plasma powers to the faceplate or substrate support of greater than, for example, 500 W, the substrate 305, such as the sidewalls defining the features 310, may be damaged.

Figure 3C:
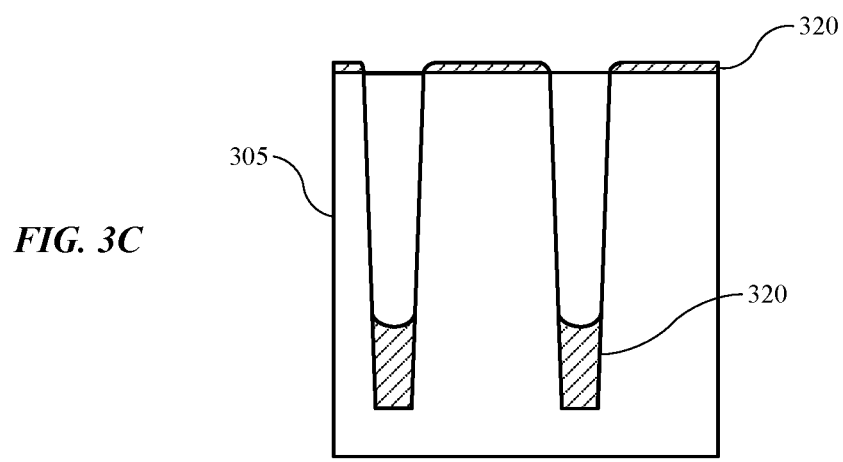

Additionally, aspects of the bias power may also be adjusted, which may also limit damage to the underlying structure. For example, the bias power may be maintained below or about 1,000 W, and may be below or about 750 W, below or about 600 W, below or about 500 W, below or about 400 W, or less. While in some operations, a bias power may be higher than a plasma source power, the bias power may alternatively be maintained below the plasma power in other operations. Applying greater bias may increase a directionality of delivery perpendicular to a plane across the substrate. Accordingly, by reducing the bias power supplied, the amount of directionality may reduce, which may increase interaction of the plasma effluents within the feature 310. As shown in FIG. 3C, the plasma effluents may then dope the material at operation 250 to form a doped silicon-and-carbon-containing material 320.

Figure 3D:
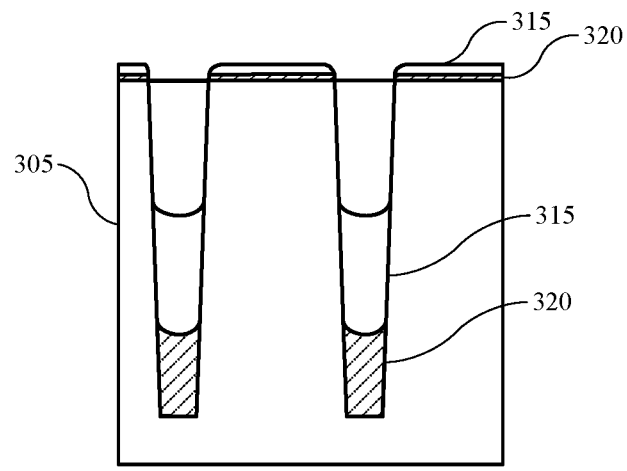
Figure 3E:
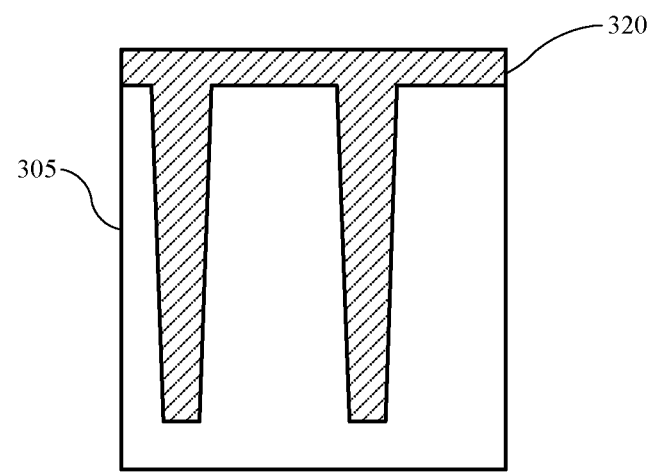

As shown in FIG. 2, the deposition, etch, and treatment operations may be repeated any number of times in cycles to fill features in embodiments of the present technology. As shown in FIGS. 3D-3E, the deposition etch, and treatment operations may fill features with silicon-and-carbon-containing material, such as amorphous silicon-and-carbon-containing material. For example, the processes may be repeated for a second cycle, a third cycle, a fourth cycle, a fifth cycle, a sixth cycle, a seventh cycle, or any number of cycles necessary to completely fill the features 310 with silicon-and-carbon-containing material 315. During each cycle, a thickness of the deposited silicon-and-carbon-containing material 315 may be maintained such that the subsequent treatment may form a uniformly doped silicon-and-carbon-containing material 320. Accordingly, a thickness of the silicon-and-carbon-containing material 315 deposited each cycle may be less than or about 5 nm, and may be less than or about 4.5 nm, less than or about 4.0 nm, less than or about 3.5 nm, less than or about 3.0 nm, less than or about 2.5 nm, or less. At greater thicknesses, the dopant in the treatment operation may not be able to fully penetrate, and may result in a non-uniform doped material.

Temperature and pressure may also impact operations of the present technology. For example, the process may be performed at a temperature below or about 450° C., and may be performed at a temperature less than or about 400° C., less than or about 350° C., less than or about 300° C., less than or about 250° C., less than or about 200° C., less than or about 150° C., or lower. The temperature may be maintained in any of these ranges throughout the method, including during the deposition, the etching, and/or the treatment, or may be adjusted during the deposition, the etching, and/or the treatment. At higher temperatures, crystallized silicon-and-carbon-containing material may be formed instead of an amorphous silicon-and-carbon-containing material. Additionally, at higher temperatures, the efficiency of the etching operation may reduce, and may increase throughput times.

Pressure within the semiconductor processing chamber may be kept relatively low for any of the processes as well, such as at a chamber pressure of less than or about 20 Torr, and pressure may be maintained at less than or about 18 Torr, less than or about 16 Torr, less than or about 14 Torr, less than or about 12 Torr, less than or about 10 Torr, less than or about 8 Torr, less than or about 6 Torr, less than or about 5 Torr, less than or about 4 Torr, less than or about 3 Torr, less than or about 2.5 Torr, less than or about 2 Torr, less than or about 1.5 Torr, less than or about 1 Torr, or less. However, lower pressures may result in a slower fill rate of the features. Additionally, higher pressures may result in reduced pattern loading and/or line bending. Accordingly, pressure within the semiconductor processing chamber during the deposition operations may be maintained at greater than or about 1 Torr, and pressure may be maintained at greater than or about 2 Torr, greater than or about 3 Torr, greater than or about 4 Torr, greater than or about 5 Torr, or more. Further, at higher pressures during the etching operations, the hydrogen may crystallize. Accordingly, pressure within the semiconductor processing chamber during the etching operations may be maintained at less than or about 3 Torr, less than or about 2.5 Torr, less than or about 2 Torr, less than or about 1.5 Torr, or less. Finally, at higher pressures during the treatment operations, directionality may increase and may non-uniformly dope the deposited material. Accordingly, pressure within the semiconductor processing chamber during the treatment operations may be maintained at less than or about 2 Torr, less than or about 1.5 Torr, less than or about 1 Torr or less. By performing processes according to some embodiments of the present technology, improved fill of narrow features utilizing silicon-and-carbon-containing materials may be produced.

Spacing between the faceplate and the substrate support may also impact operations of the present technology. A greater spacing between the faceplate and the substrate support may increase directionality of generated plasma effluents due to the increased residence time. Conversely, a reduced spacing between the faceplate and the substrate support may increase the isotropic nature of the plasma effluents. Accordingly, the spacing between the faceplate and the substrate support may be greater than or about 300 mm during the deposition operation, and may be greater than or about 320 mm, greater than or about 340 mm, greater than or about 360 mm, greater than or about 380 mm, greater than or about 400 mm, greater than or about 450 mm, greater than or about 500 mm, greater than or about 550 mm, greater than or about 600 mm, or more. During the etching operation, the spacing between the faceplate and the substrate support may be less than or about 300 mm, and may be less than or about 280 mm, less than or about 260 mm, less than or about 240 mm, less than or about 220 mm, less than or about 200 mm, or less. The spacing between the faceplate and the substrate support during the treatment operation may be between the spacing during the deposition operation and the spacing during the etching operation. The spacing during the treatment operation may impact dopant depth, and may be adjusted based on the thickness of the deposited material.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a silicon-containing precursor" includes a plurality of such precursors, and reference to "the silicon-and-carbon-containing material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   providing a silicon-containing precursor and a carbon-containing precursor to a processing region of a semiconductor processing chamber, wherein a substrate is housed in the processing region, wherein the substrate defines a feature within the substrate, wherein the processing region is at least partially defined between a faceplate and a substrate support on which the substrate is seated, and wherein the silicon-containing precursor is provided at a flow rate ratio of greater than or about 1:1 relative to the carbon-containing precursor;
   forming plasma effluents of the silicon-containing precursor and the carbon- containing precursor;
   depositing a silicon-and-carbon-containing material on the substrate;
   providing a hydrogen-containing precursor to the processing region of the semiconductor processing chamber;
   forming plasma effluents of the hydrogen-containing precursor;
   etching the silicon-and-carbon-containing material from a sidewall of the feature within the substrate with the plasma effluents of the hydrogen-containing precursor;
   providing a nitrogen-containing precursor to the processing region of the semiconductor processing chamber;
   forming plasma effluents of the nitrogen-containing precursor; and
   doping the silicon-and-carbon-containing material with nitrogen from the plasma effluents of the nitrogen-containing precursor.

2. The semiconductor processing method of claim 1, wherein:
   the feature within the substrate is characterized by an aspect ratio of greater than or about 2:1; and
   the feature is characterized by a width across the feature of less than or about 20 nm.

3. The semiconductor processing method of claim 1, wherein:
   a bias power is applied to the substrate support from a bias power source; and
   the bias power source is operated in a pulsing mode at a pulsing frequency of less than or about 1 kHz during both the depositing and the etching.

4. The semiconductor processing method of claim 3, wherein the bias power source is operated at a duty cycle of less than or about 50% during both the depositing and the etching.

5. The semiconductor processing method of claim 3, wherein a plasma power source is operated in a continuous wave mode while the bias power source is operated in a pulsing mode during the depositing and the etching.

6. The semiconductor processing method of claim 1, wherein:
   the plasma effluents of the silicon-containing precursor and the carbon-containing precursor are formed at a first power level from a plasma power source; and
   the plasma effluents of the hydrogen-containing precursor are formed at a second power level from the plasma power source less than the first power level.

7. The semiconductor processing method of claim 1, further comprising:
   subsequent to depositing the silicon-and-carbon-containing material, densifying the silicon-and-carbon-containing material within the feature defined within the substrate, wherein the densifying comprises reducing a hydrogen content of the silicon-and-carbon-containing material to less than or about 30 at. %.

8. The semiconductor processing method of claim 1, wherein the silicon-containing precursor is provided at a flow rate ratio of greater than or about 2:1 relative to the carbon-containing precursor.

9. The semiconductor processing method of claim 1, wherein the method is repeated for a second cycle.

10. The semiconductor processing method of claim 1, wherein a thickness of the silicon-and-carbon-containing material is less than or about 5 nm.

11. The semiconductor processing method of claim 1, wherein a pressure within the semiconductor processing chamber is maintained at a pressure of less than or about 10 Torr.

12. A semiconductor processing method comprising:
i) forming plasma effluents of a silicon-containing precursor and a carbon-containing precursor at a first power level from a plasma power source;
ii) depositing a silicon-and-carbon-containing material on a substrate, wherein the substrate defines a feature within the substrate, and wherein the substrate is seated on a substrate support;
iii) forming plasma effluents of a hydrogen-containing precursor at a second power level from the plasma power source less than the first power level;
iv) etching the silicon-and-carbon-containing material from a sidewall of the feature within the substrate with the plasma effluents of the hydrogen-containing precursor;
v) forming plasma effluents of a nitrogen-containing precursor;
vi) doping the silicon-and-carbon-containing material with nitrogen from the plasma effluents of the nitrogen-containing precursor; and
repeating operations i) through vi) to iteratively fill the feature.

13. The semiconductor processing method of claim 12, wherein:
a bias power is applied to the substrate support from a bias power source; and
the bias power source is operated in a pulsing mode at a frequency of less than or about 1 kHz.

14. The semiconductor processing method of claim 13, wherein the bias power source is operated at a duty cycle of less than or about 25%.

15. The semiconductor processing method of claim 13, wherein the bias power source is operated at a plasma power of less than or about 750 W.

16. The semiconductor processing method of claim 12, wherein the etching fully removes the silicon-and-carbon-containing material from sidewalls of the feature above a base fill of the feature.

17. The semiconductor processing method of claim 12, wherein the carbon-containing precursor comprises a silicon-and-carbon containing precursor.

18. The semiconductor processing method of claim 12, wherein a temperature of the substrate is maintained at a temperature of greater than or about 100° C.

19. A semiconductor processing method comprising:
providing a silicon-containing precursor and a carbon-containing precursor to a processing region of a semiconductor processing chamber, wherein a substrate is housed in the processing region, wherein the substrate defines a feature within the substrate, and wherein the processing region is at least partially defined between a faceplate and a substrate support on which the substrate is seated;
forming plasma effluents of the silicon-containing precursor and the carbon-containing precursor, wherein the plasma effluents of the silicon-containing precursor are formed at a first power level from a plasma power source;
depositing a silicon-and-carbon-containing material on the substrate, wherein a carbon content of the silicon-and-carbon-containing material is less than or about 50 at. %;
providing a hydrogen-containing precursor to the processing region of the semiconductor processing chamber;
forming plasma effluents of the hydrogen-containing precursor, wherein the plasma effluents of the hydrogen-containing precursor are formed at a second power level from the plasma power source less than the first power level;
etching the silicon-and-carbon-containing material from a sidewall of the feature within the substrate with the plasma effluents of the hydrogen-containing precursor, wherein the etching fully removes the silicon-and-carbon-containing material from sidewalls of the feature above a base fill of the feature;
providing a nitrogen-containing precursor to the processing region of the semiconductor processing chamber;
forming plasma effluents of the nitrogen-containing precursor; and
doping the silicon-and-carbon-containing material with nitrogen from the plasma effluents of the nitrogen-containing precursor.

20. The semiconductor processing method of claim 19, wherein:
depositing the silicon-and-carbon-containing material on the substrate is performed at a first spacing distance from the faceplate; and
etching the silicon-and-carbon-containing material from the sidewall of the feature within the substrate is performed at a second spacing distance from the faceplate, wherein the second spacing distance is less than the first spacing distance.

21. The semiconductor processing method of claim 1, wherein the silicon-containing precursor comprises silane ($SiH_4$) and the carbon-containing precursor comprises trimethylsilane ($C_3H_{10}Si$) or tetramethylsilane ($C_4H_{12}Si$).

* * * * *